(12) United States Patent
Lu et al.

(10) Patent No.: US 10,930,730 B2
(45) Date of Patent: Feb. 23, 2021

(54) ENHANCED ACTIVE AND PASSIVE DEVICES FOR RADIO FREQUENCY (RF) PROCESS AND DESIGN TECHNOLOGY

(71) Applicant: QUALCOMM Incorporated, San Diego, CA (US)

(72) Inventors: Ye Lu, San Diego, CA (US); Yun Yue, San Diego, CA (US); Phanikumar Konkapaka, San Diego, CA (US); Bin Yang, San Diego, CA (US); Chuan-Hsing Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3 days.

(21) Appl. No.: 15/816,295

(22) Filed: Nov. 17, 2017

(65) Prior Publication Data

US 2019/0027554 A1 Jan. 24, 2019

Related U.S. Application Data

(60) Provisional application No. 62/534,154, filed on Jul. 18, 2017.

(51) Int. Cl.
| | |
|---|---|
| *H01L 23/52* | (2006.01) |
| *H01L 27/08* | (2006.01) |
| *H01L 29/06* | (2006.01) |
| *H01L 23/522* | (2006.01) |
| *H01L 29/78* | (2006.01) |
| *H01L 29/93* | (2006.01) |

(52) U.S. Cl.
CPC ...... *H01L 29/0619* (2013.01); *H01L 23/5226* (2013.01); *H01L 29/0696* (2013.01); *H01L 29/78* (2013.01); *H01L 29/785* (2013.01); *H01L 29/93* (2013.01)

(58) Field of Classification Search
CPC . H01L 29/0619; H01L 29/06; H01L 29/0696; H01L 23/52; H01L 23/522; H01L 23/5226; H01L 27/08; H01L 27/0886
USPC ........................................................ 257/494
See application file for complete search history.

(56) References Cited

U.S. PATENT DOCUMENTS

| | | | |
|---|---|---|---|
| 5,019,002 A | 5/1991 | Holmberg | |
| 6,268,778 B1 | 7/2001 | Mucke et al. | |
| 7,188,038 B2 * | 3/2007 | Picollet | G01R 27/2605 324/600 |
| 7,865,850 B1 * | 1/2011 | Kao | G06F 17/5068 703/14 |
| 8,901,661 B2 | 12/2014 | Mauder et al. | |
| 9,224,488 B2 | 12/2015 | Shikata et al. | |
| 9,960,267 B2 * | 5/2018 | Miyakoshi | H01L 29/42372 |

(Continued)

OTHER PUBLICATIONS

International Search Report and Written Opinion—PCT/US2018/034467—ISA/EPO—dated Jan. 7, 2019.

*Primary Examiner* — Fazli Erdem
(74) *Attorney, Agent, or Firm* — Seyfarth Shaw LLP

(57) ABSTRACT

A metal-oxide-semiconductor (MOS) device for radio frequency (RF) applications may include a guard ring. The guard ring may surround the MOS device and at least one other MOS device. The MOS device may further include a level zero contact layer coupled to a first interconnect layer through level zero interconnects and vias. The first interconnect layer may be for routing to the MOS device.

15 Claims, 15 Drawing Sheets

(56) References Cited

U.S. PATENT DOCUMENTS

| | | | |
|---|---|---|---|
| 2004/0268284 A1* | 12/2004 | Perez | G06F 17/5068 |
| | | | 716/119 |
| 2007/0090447 A1 | 4/2007 | Morimoto et al. | |
| 2009/0152649 A1* | 6/2009 | Kim | H01L 29/0619 |
| | | | 257/409 |
| 2010/0200921 A1* | 8/2010 | Fuchigami | H01L 27/0251 |
| | | | 257/358 |
| 2011/0204969 A1* | 8/2011 | Chen | H01L 29/94 |
| | | | 327/581 |
| 2012/0074515 A1* | 3/2012 | Chen | H01L 23/66 |
| | | | 257/491 |
| 2012/0306023 A1* | 12/2012 | Ma | H01L 21/76816 |
| | | | 257/401 |
| 2013/0088372 A1* | 4/2013 | Lundstrum | H03K 17/9622 |
| | | | 341/33 |
| 2014/0167292 A1* | 6/2014 | Masumura | H01L 25/18 |
| | | | 257/784 |
| 2014/0232007 A1 | 8/2014 | Kasai et al. | |
| 2014/0306293 A1* | 10/2014 | Baek | H01L 27/088 |
| | | | 257/394 |
| 2015/0021713 A1* | 1/2015 | Cheng | H01L 29/7851 |
| | | | 257/409 |
| 2015/0104925 A1 | 4/2015 | Chen et al. | |
| 2018/0248001 A1* | 8/2018 | Stamper | H01L 29/0619 |

* cited by examiner

ENHANCED ACTIVE AND PASSIVE DEVICES FOR RADIO FREQUENCY (RF) PROCESS AND DESIGN TECHNOLOGY

CROSS-REFERENCE TO RELATED APPLICATION

The present application claims the benefit of U.S. Provisional Patent Application No. 62/534,154, filed on Jul. 18, 2017, and titled "ENHANCED ACTIVE AND PASSIVE DEVICES FOR RADIO FREQUENCY (RF) PROCESS AND DESIGN TECHNOLOGY," the disclosure of which is expressly incorporated by reference herein in its entirety.

BACKGROUND

Field

Aspects of the present disclosure relate to design of semiconductor devices, and, more particularly, to designing active and passive radio frequency (RF) devices.

Background

Interconnect layers are often used for connecting different devices together on an integrated circuit. As integrated circuits become more complex, more interconnect layers are employed for providing electrical connections between the different devices. More recently, the number of interconnect levels for circuitry has substantially increased due to the large number of transistors now interconnected in modern electronic devices. The increased number of interconnect levels for supporting the increased number of transistors involves more intricate processes.

Interconnect layers for connecting radio frequency (RF) devices at lower, back-end-of-line (BEOL) interconnect layers provide RF designers with design flexibility. The design of mobile RF transceivers may include using a voltage-controlled capacitance and/or a tunable capacitor (e.g., a varactor) for advanced RF applications. For example, tunable capacitors may provide impedance matching in RF circuits of advanced RF applications. In addition, semiconductor devices (e.g., field effect transistors (FETs)) are also important in RF design. Unfortunately, the configuration of these semiconductor devices is based on a traditional, fixed p-cell methodology.

Parameterized data cells (e.g., p-cells) are circuit components having a variable structure depending on one or more parameters. P-cells may be automatically generated by electronic design automation (EDA) software based on the values of the one or more parameters. For example, a user may create a transistor p-cell. Once created, the different instances of the transistor p-cell may be defined using various lengths and widths for forming a variety of transistors.

Unfortunately, conventional digital p-cells are optimized for digital logic design rather than RF design for an RF device. These conventional digital p-cells may not include RF parameters suitable for schematic RF model simulation. As a result, a significant design gap arises between schematic and layout designs, which increases design cycles for RF devices. In addition, these conventional digital p-cells may not support guard rings, which are important for RF design.

RF p-cells are available for RF design. Unfortunately, conventional RF p-cells generally do not provide access to lower BEOL interconnect layers. By contrast, digital p-cells may provide some accesses to lower BEOL interconnect layers. RF designers, therefore, lose design flexibility for connecting devices at lower BEOL interconnect layers when using conventional RF p-cells.

SUMMARY

A metal-oxide-semiconductor (MOS) device for radio frequency (RF) applications may include a guard ring. The guard ring may surround the MOS device and at least one other MOS device. The MOS device may further include a level zero contact layer coupled to a first interconnect layer through level zero interconnects and vias. The first interconnect layer may be for routing to the MOS device.

A metal-oxide-semiconductor (MOS) p-cell device for radio frequency (RF) design may include a configurable guard ring. The configurable guard ring may surround multiple MOS devices. The MOS p-cell device may further include a model of RF parasitic elements. The MOS p-cell device may further include a level zero contact layer coupled to a first interconnect layer through level zero interconnects and vias. The first interconnect layer may be for routing to the MOS device.

A method of fabricating a metal-oxide-semiconductor (MOS) device for radio frequency (RF) applications may include fabricating a level zero contact layer. The method may further include coupling the level zero contact layer to a first interconnect layer through level zero interconnects and vias. The method may further include fabricating a guard ring to surround the MOS device and at least one other MOS device.

A non-transitory computer-readable medium may include program code recorded thereon for design of a radio frequency (RF) device. The program code may be executed by a processor. The program code may generate a configurable guard ring surrounding a plurality of MOS devices. The program code may further generate a model of RF parasitic elements. The program code may enable coupling of a level zero contact layer to a first interconnect layer through level zero interconnects and vias. The first interconnect layer may be for routing to the RF device.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
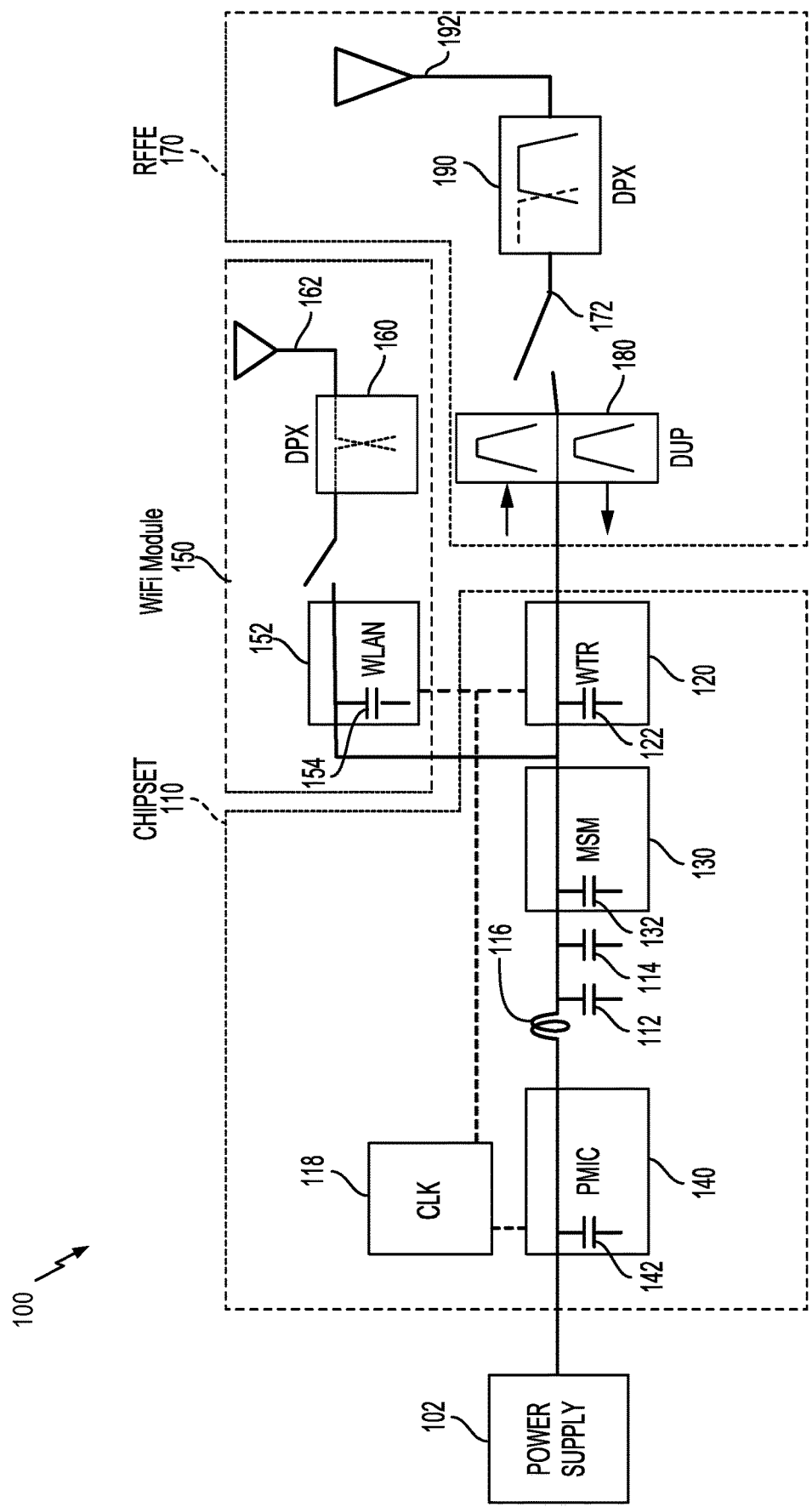
FIG. 1 is a schematic diagram of a radio frequency (RF) front end module and a WiFi module employing diplexers for a chipset to provide carrier aggregation.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Complementary metal-oxide-semiconductor (CMOS) fabrication processes are often divided into three parts: a front-end-of-line (FEOL), a middle-of-line (MOL), and a back-end-of-line (BEOL). Front-end-of-line processes include wafer preparation, isolation, well formation, gate patterning, spacers, and dopant implantation. A middle-of-line process includes gate and terminal contact formation. Back-end-of-line processes include forming interconnects and dielectric layers for coupling to the FEOL devices.

Interconnect layers are often used to connect different devices together on an integrated circuit. As integrated circuits become more complex, more interconnect layers provide the electrical connections between devices. More recently, the number of interconnect levels for circuitry has substantially increased due to the large number of transistors that are now interconnected in a modern electronic device. The increased number of interconnect levels for supporting the increased number of transistors involves more intricate processes.

Interconnect layers for connecting radio frequency (RF) devices at lower, back-end-of-line (BEOL) interconnect layers provide RF designers with design flexibility. For example, the design of mobile RF transceivers may include the use of a voltage-controlled capacitance and/or a tunable capacitor (e.g., a varactor) for advanced RF applications. In addition, semiconductor devices, such as field effect transistors (FETs), are also important in RF design.

Semiconductor devices including, but not limited to, baseband (BB) MOS (metal-oxide-semiconductor) varactors (BB MosVar), baseband (BB) MOS (metal-oxide-semiconductor) field effect transistors (FET) (BB FET), RF MOS FETs (RF FET) and RF MOS varactors (RF MosVar), and other digital chips are important in RF design. Unfortunately, the configuration of these semiconductor devices is based on a traditional, fixed p-cell methodology.

For example, conventional BB devices do not enable RF design enhancement. That is because their configuration is based on a preference for logic design, and omits RF components suitable for RF schematic simulation. As such, models of BB MosVar and BB FET devices do not include RF components for a schematic simulation. These devices also lack a guard ring.

Additionally, the RF MosVar p-cell is characterized down to a second BEOL interconnect level (e.g., metal two (M2)), and the RF FET device is characterized down to a fourth BEOL interconnect level (e.g., metal four (C4)). Routing below the M2 level (or C4 level) is therefore not available because parameters of the device are not characterized below M2 (or C4). As a result, designers may only design and route the device starting from the M2 (C4) level. There is no ability to change interconnect routing and design below the M2 level (e.g., metal one (M1) or metal zero (M0) (or C4 for FET devices), which results in design inflexibility.

Therefore, it would be desirable to combine the advantages of both BB devices and RF p-cells for providing RF simulation capability as well as flexible design choices for RF designers.

Aspects of the present disclosure address these issues by providing MOS varactors and MOSFETs for RF design. For example, the p-cells for MOS varactors and MOSFETs include a guard ring and RF parasitic elements. This enables design flexibility to connect devices at lower interconnect levels, as well as protection of the device by the guard ring. Additionally, the lower level characterization helps reduce the schematic and layout simulation gap, to reduce an RF design cycle.

Advantages include increased RF model simulation design accuracy by including a model of RF parasitic elements. Another advantage includes ease of design for p-cells because there are no p-cell constraints up to the M2 layer, and flexibility for chip layout design resulting in chip area reduction. Additional advantages include a significant reduction in the gap between schematic and layout design, which therefore reduces design cycles for faster design success.

It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms wafer and die may be used interchangeably. As described herein, the terms "p-cell" and "device" may be used interchangeably.

Aspects of the present disclosure provide metal-oxide semiconductor (MOS) devices for radio frequency (RF) applications. The MOS devices may include a guard ring for surrounding the MOS device and at least one other MOS device. The MOS device may further include a level zero contact layer coupled to a first interconnect layer through level zero interconnects and vias. The first interconnect layer may be used for routing to the MOS device.

According to additional aspects of the present disclosure, a MOS p-cell device for RF design includes a configurable guard ring for surrounding multiple MOS devices. The p-cell device may further include a model of RF parasitic elements and a level zero contact layer coupled to a first interconnect layer through level zero interconnects and vias. The first interconnect layer may be used for routing to the MOS device. For example, the zero interconnect layer may be coupled to a gate and a drain of the MOS device.

FIG. 1 is a schematic diagram of a wireless device 100 (e.g., a cellular phone or a smartphone) including active and passive radio frequency (RF) devices. The wireless device 100 has a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes the second diplexer 190 communicably coupling an antenna 192 to the wireless transceiver 120 (WTR) through a duplexer 180 (DUP). An RF switch 172 communicably couples the second diplexer 190 to the duplexer 180.

Figure 2:
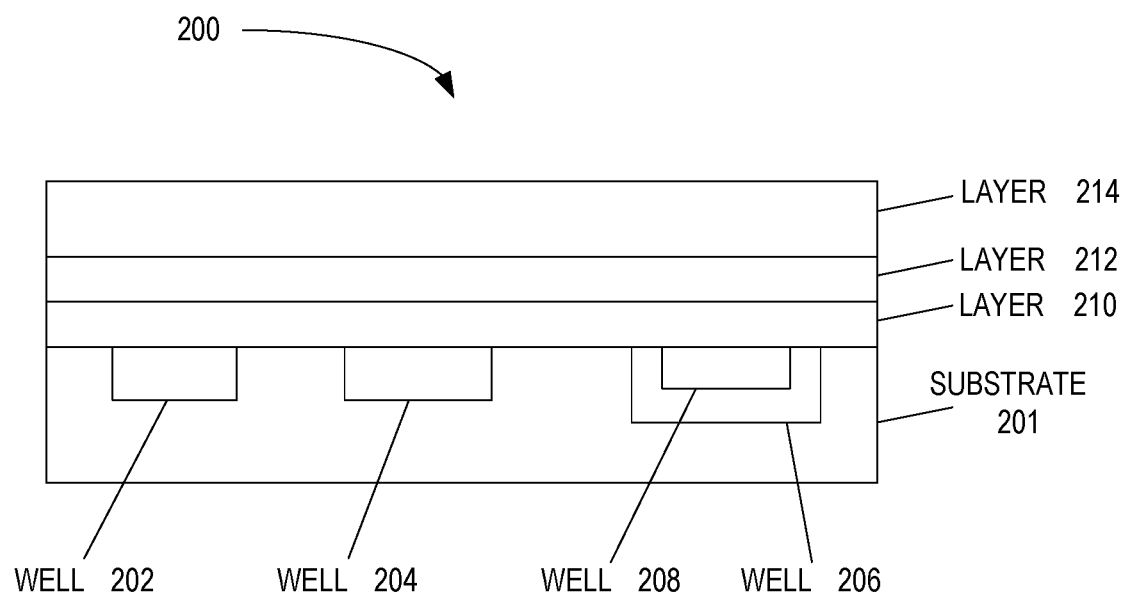
FIG. 2 illustrates a cross-sectional view of a die.

The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components FIG. 2 illustrates a cross-sectional view of a die 200. In the die 200, there may be a substrate 201, which may be a semiconductor material and/or may act as a mechanical support for electronic devices. The substrate 201 may be a doped semiconductor substrate, which has either electrons (designated N-channel) or holes (designated P-channel) charge carriers present throughout the substrate 201. Subsequent doping of the substrate 201 with charge carrier ions/atoms may change the charge carrying capabilities of the substrate 201.

Within a substrate 201 (e.g., a semiconductor substrate), there may be wells 202 and 204 of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 201.

The substrate 201 may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 200.

Layers (e.g., 210 through 214) may be added to the die 200. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 201, from external forces. For example, and not by way of limitation, the layer 214 may be a layer that protects the die 200 from mechanical damage, or the layer 214 may be a layer of material that protects the die 200 from electromagnetic or radiation damage.

Electronic devices designed on the die 200 may comprise many features or structural components. For example, the die 200 may be exposed to any number of methods to impart dopants into the substrate 201, the wells 202-208, and, if desired, the layers (e.g., 210-214). For example, and not by way of limitation, the die 200 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 201 and the wells 202-208, many different structures and electronic devices may be formed within the scope of the present disclosure.

Further, the substrate 201, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3A:
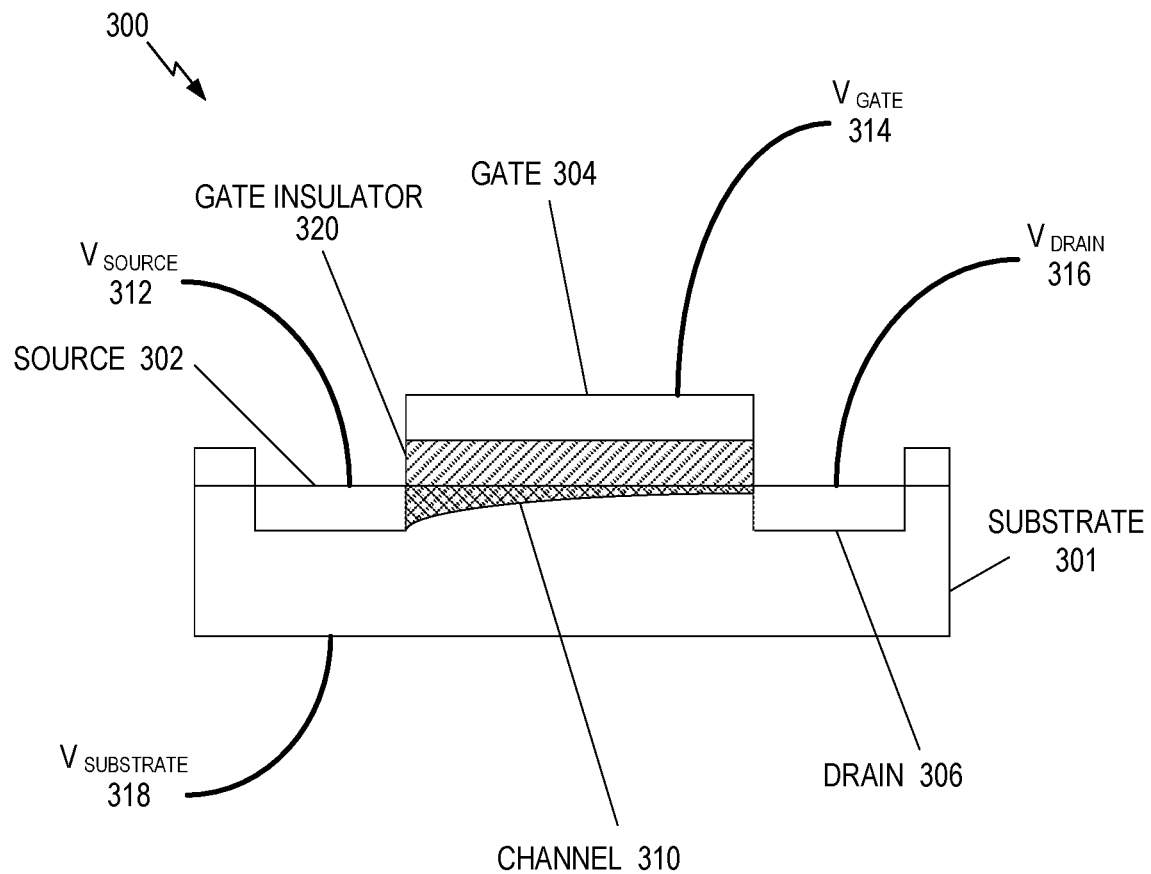
FIG. 3A illustrates a cross-sectional view of a metal-oxide-semiconductor field-effect transistor (MOSFET) device.
Figure 3A:
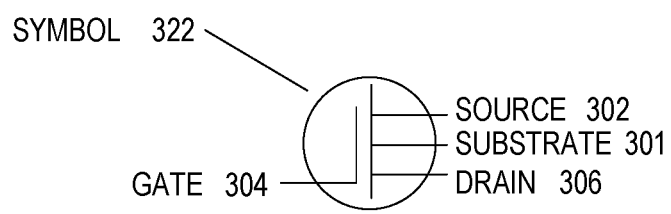

FIG. 3A illustrates a cross-sectional view of a metal-oxide-semiconductor field-effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 301, or may be fabricated as areas above the substrate 301, or as part of other layers on the MOSFET device 300. Such other structures may be a fin or other structure that protrudes from a surface of the substrate 301. Further, the substrate 301 may be the substrate 201 on the die 200, but substrate 301 may also be one or more of the layers (e.g., 210-214) that are coupled to the substrate 201.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314, or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For p-type MOSFETs (using holes as charge carriers in the channel 310), an arrow is applied to the substrate 308 terminal in the symbol 322 pointing toward the gate 304 terminal.

The gate 304 may also be made of different materials. In some designs, the gate 304 is made from polycrystalline silicon, also referred to as polysilicon or poly, which is a conductive form of silicon. Although referred to as "poly" or "polysilicon" herein, metals, alloys, or other electrically conductive materials are contemplated as appropriate materials for the gate 304 as described in the present disclosure.

In some MOSFET designs, a high-K value material may be desired in the gate insulator 320, and in such designs, other conductive materials may be employed. For example, and not by way of limitation, a "high-K metal gate" design may employ a metal, such as copper, for the gate 304 terminal. Although referred to as "metal," polycrystalline materials, alloys, or other electrically conductive materials are contemplated as appropriate materials for the gate 304 as described in the present disclosure.

To interconnect to the MOSFET device 300, or to interconnect to other devices in the die 200 (FIG. 2), interconnect traces or layers are used. These interconnect traces may be in one or more of layers (e.g., 210-214), or may be in other layers of the die 106. A lower interconnect layer (e.g., below M4) may be available for routing to a metal-oxide-semiconductor (MOS) device.

Figure 3B:
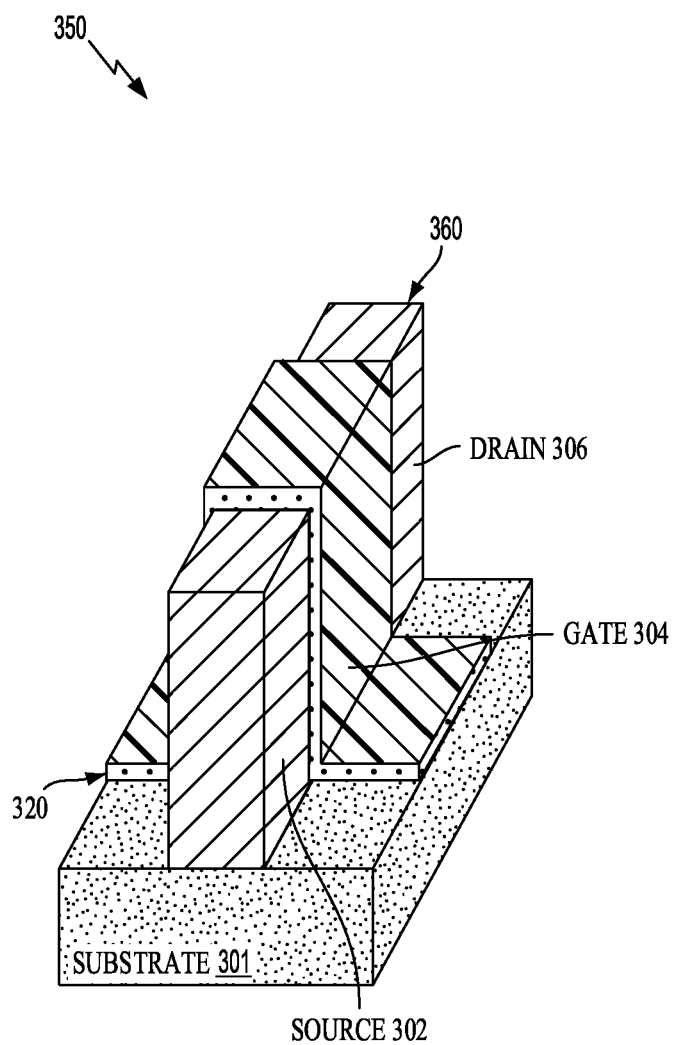
FIG. 3B illustrates a fin field-effect transistor (FinFET).

FIG. 3B illustrates a fin-structured FET (FinFET) 350 that operates in a similar fashion to the MOSFET device 300 described with respect to FIG. 3A. A fin 360 in a FinFET 350, however, is grown or otherwise coupled to the substrate 301. The substrate 301 may be a semiconductor substrate or other like supporting layer, for example, comprised of an oxide layer, a nitride layer, a metal oxide layer, or a silicon layer. The fin 360 includes the source 302 and the drain 306. A gate 304 is disposed on the fin 360 and on the substrate 301 through a gate insulator 320. A FinFET transistor is a 3D fin-based metal-oxide-semiconductor field-effect transistor (MOSFET). As a result, the physical size of the FinFET 350 may be smaller than the MOSFET device 300 structure shown in FIG. 3A.

Figure 4:
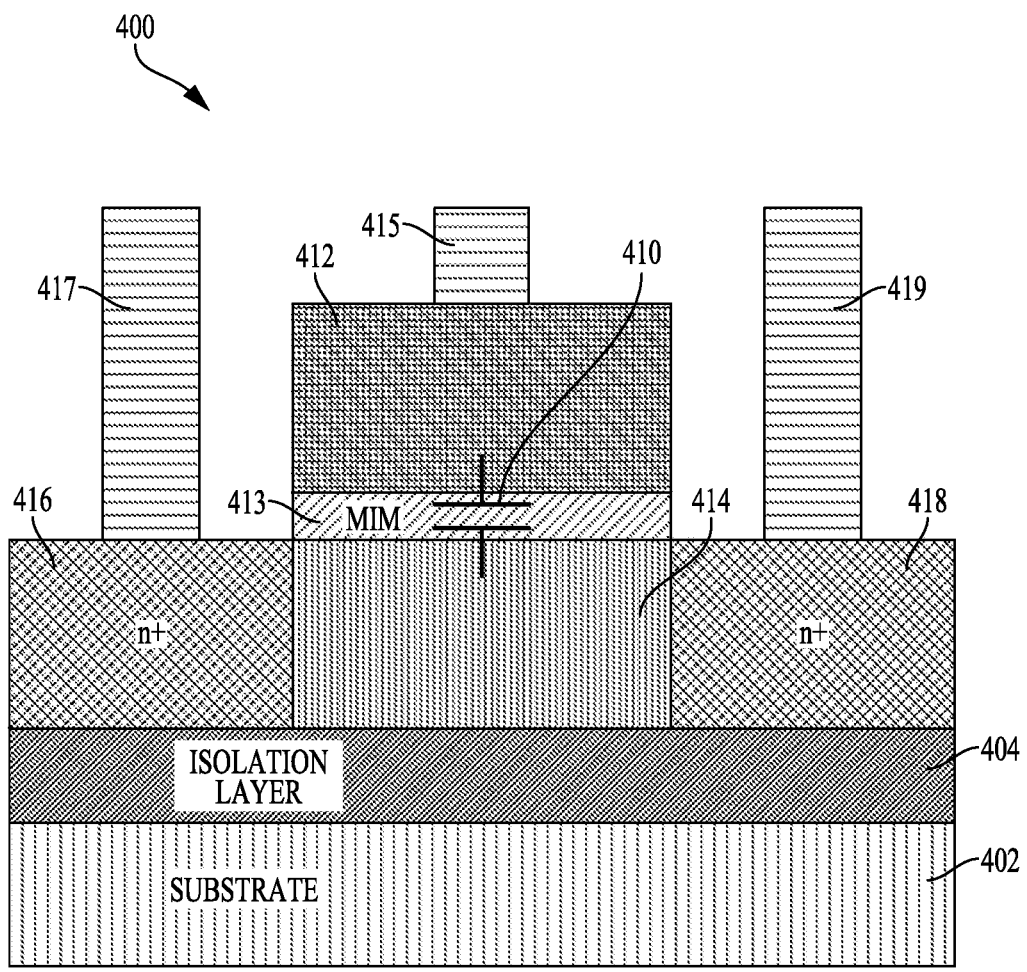
FIG. 4 illustrates a complementary metal-oxide-semiconductor (CMOS) varactor.

FIG. 4 illustrates a complementary metal-oxide-semiconductor (CMOS) varactor 400. Representatively, the CMOS varactor 400 includes a gate operating as a second plate 414, a gate oxide layer operating as a dielectric layer 413 and a body operating as a first plate 412 of a metal-insulator-metal (MIM) capacitor 410. In addition, a first doped region 416 and a second doped region 418 surround the first plate 412 (e.g., the body) to modulate a distance between the first plate 412 and the second plate 414 of the MIM capacitor 410 to provide a variable capacitance. The CMOS varactor 400 is supported on a backside by an isolation layer 404 (e.g., a buried oxide layer) on a substrate 402 (e.g., handle silicon (Si)). In the CMOS varactor 400, a plate width modulates to vary an electric field formed between the capacitor plates adjusting a distance between the first plate 412 and the second plate 414.

As shown in FIG. 4, the first plate 412 is modulated to vary an electric field formed between the first plate 412 and the second plate 414 according to an input node 415 and output nodes 417 and 419. A capacitance of the MIM capacitor 410 is generally controlled by a thickness of the dielectric layer 413. In the CMOS varactor 400, however, the capacitance is adjusted according to an inversion and depletion between the input node 415 and output nodes 417 and 419, which operates effectively as a diode.

Figure 5A:
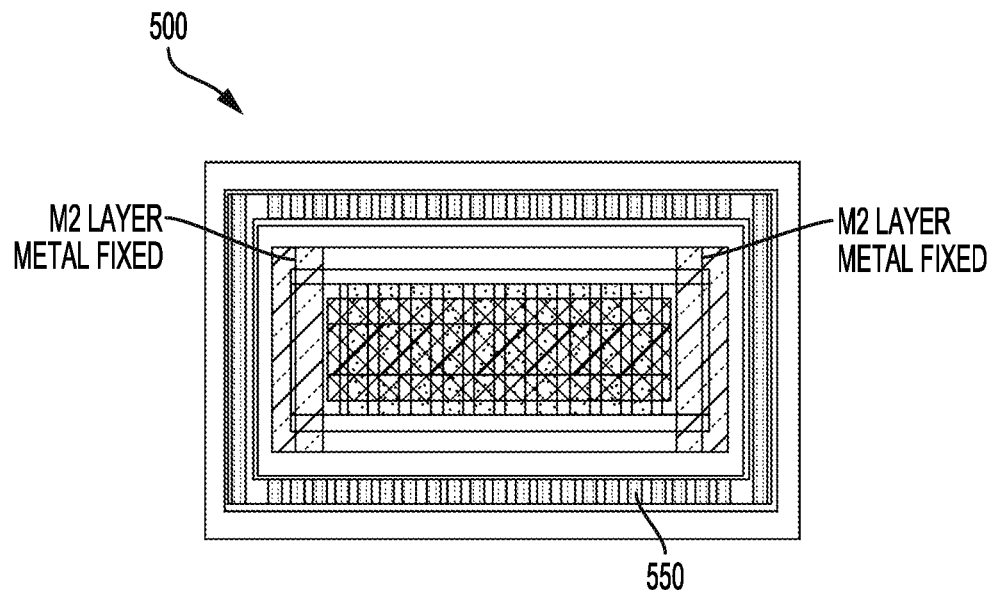
FIG. 5A illustrates a schematic layout of a conventional radio frequency (RF) metal-oxide-semiconductor (MOS) variable capacitor (RF MosVar).
Figure 5B:
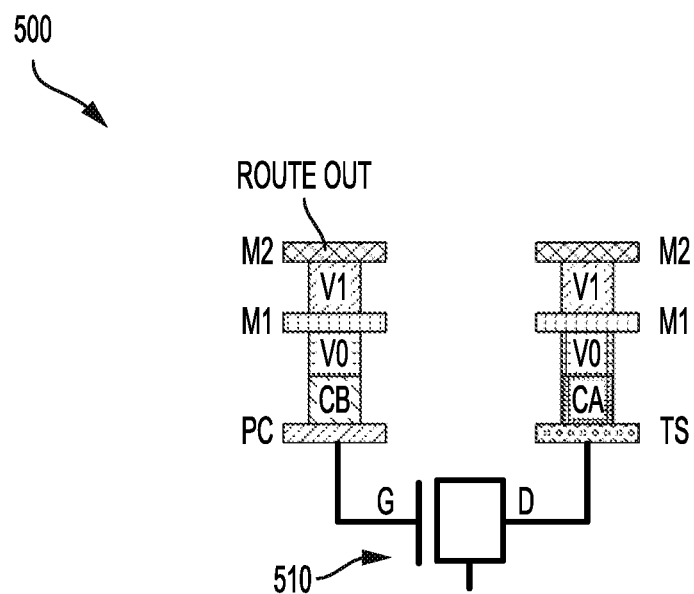
FIG. 5B illustrates a cross-sectional view of the RF MosVar of FIG. 5A.

Interconnect layers for connecting radio frequency (RF) devices at lower, back-end-of-line (BEOL) interconnect layers provide RF designers with design flexibility. For example, designing mobile RF transceivers using the CMOS varactor 400 enables a voltage-controlled capacitance and/or a tunable capacitor for advanced RF applications. In addition, semiconductor devices, such as the MOSFET device 300 as well as the FinFET 350 are also important in RF design. Interconnect layers for connecting radio RF devices at lower, BEOL interconnect layers are illustrated in FIGS. 5A-5B. Unfortunately, the configuration of these RF devices is based on a traditional, fixed parameterized cell (p-cell) methodology.

FIGS. 5A-5B illustrate a schematic layout and a cross-sectional view of a conventional RF MOS variable capacitor (e.g., RF MosVar 500). The RF MosVar 500 may include a device 510 and a guard ring 550. The device 510 may include a gate (G) and a drain (D). Multiple interconnect (e.g., routing) layers are coupled to each of the gate and the drain of the device 510. In addition, a polysilicon contact (PC) layer is coupled to the gate. An M1 layer is coupled to the PC layer through a via V0 and a trench interconnect (CB). An M2 layer is coupled to the M1 layer through a via V1. Additionally, a titanium silicide (TS) layer is coupled to the drain. The M1 layer is coupled to the TS layer through the via V0 and a trench interconnect (CA). The M2 layer is coupled to the M1 layer through the via V1.

The characterization of the RF MosVar 500 is defined through the M2 layer. That is, interconnecting/routing for the RF MosVar 500 is fixed beginning at the M2. An RF designer, therefore, has no ability to modify the interconnecting/routing of the RF MosVar 500 below the M2 layer. Additionally, the schematic layout of the RF MosVar 500 does not include RF components for schematic simulation and design, which further limits the design of the RF MosVar 500.

Figure 5C:
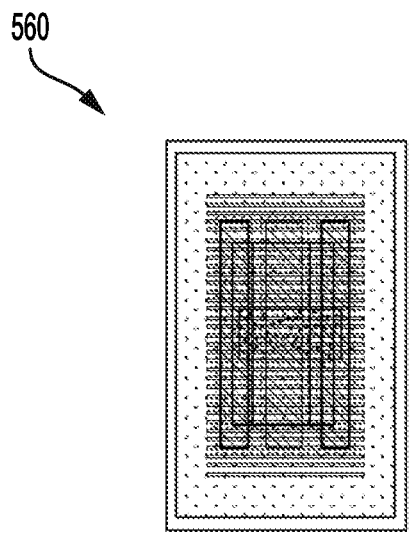
FIG. 5C illustrates a schematic layout of a conventional baseband (BB) metal-oxide-semiconductor (MOS) variable capacitor (BB MosVar).
Figure 5D:
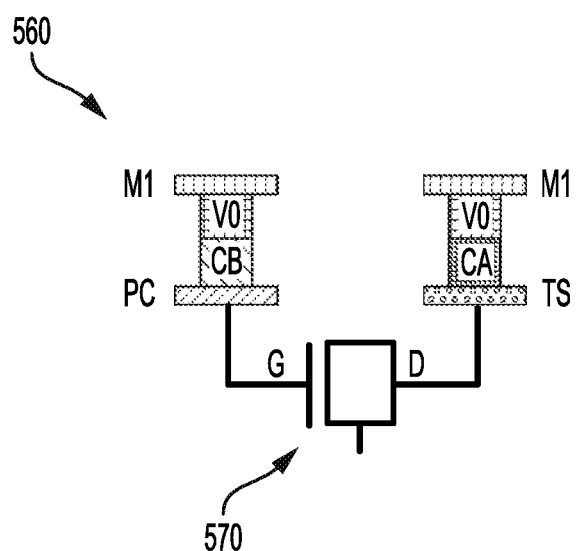
FIG. 5D illustrates a cross-sectional view of the BB MosVar of FIG. 5C.

FIGS. 5C-5D illustrate a schematic layout and a cross-sectional view of a conventional baseband (BB) MOS variable capacitor (e.g., BB MosVar 560). The BB MosVar 560 includes a device 570 with a gate (G) and a drain (D). Similarly, a polysilicon contact (PC) layer is coupled to the gate, and an M1 layer is coupled to the PC layer through a via V0 and a trench interconnect (CB). Additionally, a titanium silicide (TS) layer is coupled to the drain, and the M1 layer is coupled to the TS layer through the via V0 and a trench interconnect (CA). The BB MosVar 560 schematic simulation omits a guard ring that is specified in RF circuits.

The characterization of the BB MosVar 560 is defined through the M1 layer. That is, interconnecting/routing for the BB MosVar 560 is fixed beginning at the M1 layer. An RF designer, therefore, has no ability to modify the interconnecting/routing of the BB MosVar 560 below the M1 layer. While the schematic layout of the BB MosVar 560 enables interconnecting/routing variation after the M1 layer, the schematic layout of the BB MosVar 560 does not include RF components for schematic simulation and design, which further limits the design of the BB MosVar 560.

Figure 6A:
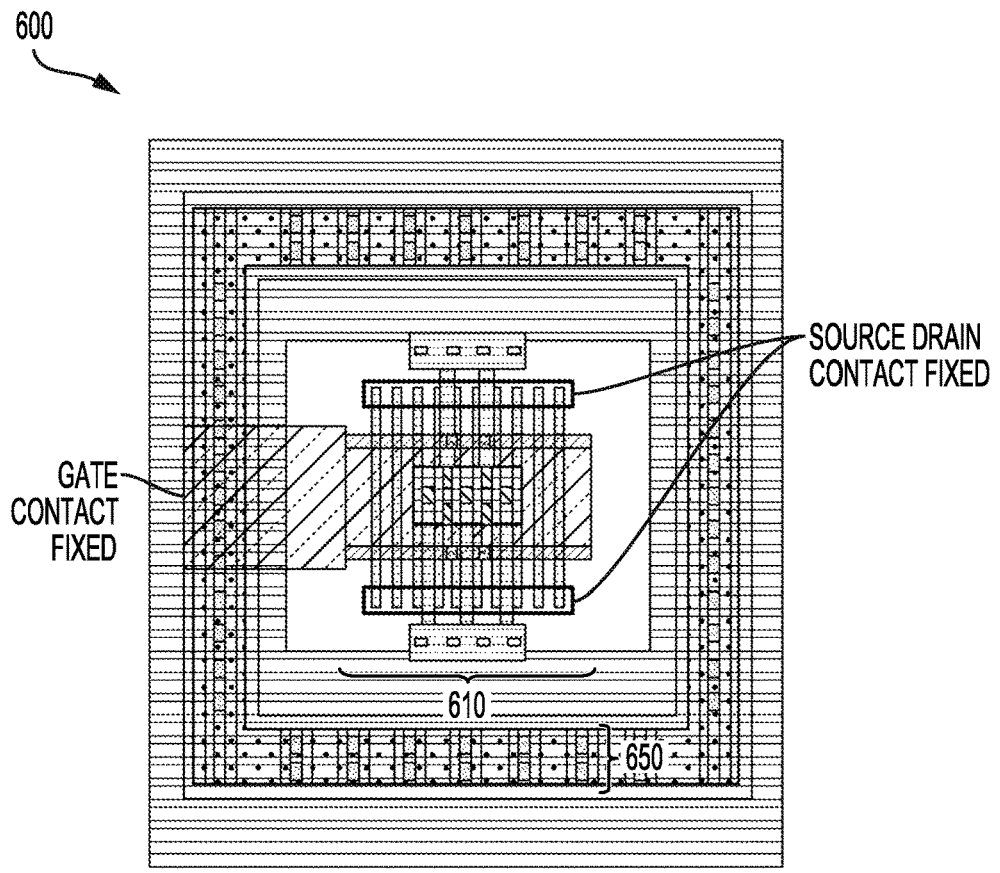
FIG. 6A illustrates a schematic layout of a conventional radio frequency (RF) field effect transistor (FET).
Figure 6B:
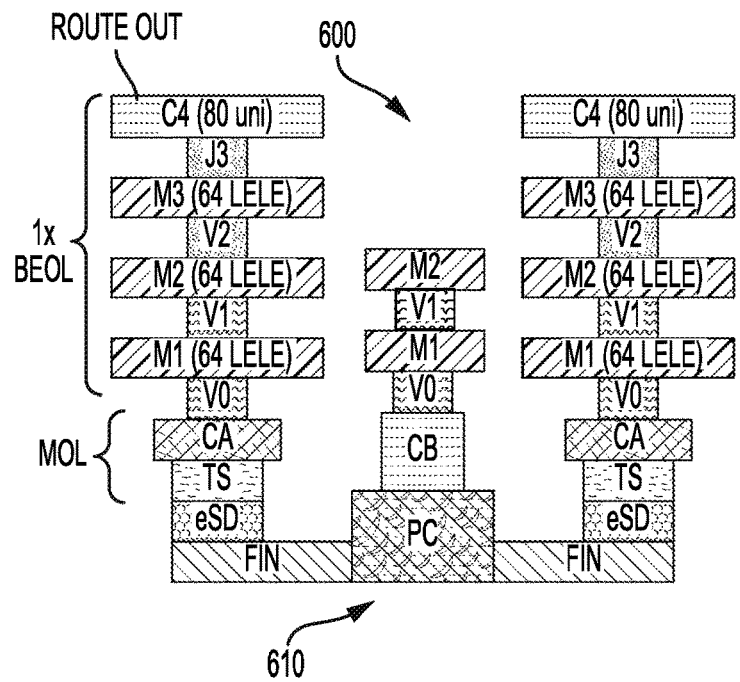
FIG. 6B illustrates a cross-sectional view of the RF FET of FIG. 6A.

FIGS. 6A-6B illustrate a schematic layout and a cross-sectional view of a conventional RF FET. As shown in FIG. 6A, an RF FET 600 includes a transistor 610 and a guard ring 650. The transistor 610 includes a gate, a source region, and a drain region that are all fixed. The transistor 610 may include fins (FIN) coupled to a polysilicon contact (PC) layer. Each fin supports either the source region or the drain region (eSD). In addition, trench interconnects (CA) are coupled to each of the source region or the drain region through a TS (titanium silicide) layer. A fixed routing of the contacts to the source/drain regions and the gate of the transistor 610 are illustrated in FIG. 6B.

A shown in FIG. 6B, an M1 layer is coupled to the CA trench interconnect through a via V0. An M2 layer is coupled to the M1 layer through a via V1. An M3 layer is coupled to the M2 layer through a via V2. A C4 layer is coupled to the M3 layer through a via J3. Additionally, a PC layer supports a trench interconnect CB for contacting the gate. The M1 layer is coupled to the CB trench interconnect through a via V0, and the M2 layer is coupled to the M1 layer through a via V1. The CA trench interconnect and the TS layer may form middle-of-line (MOL) layers, and layers C4 through M1 may form BEOL layers.

In this example, a schematic simulation and design of the RF FET 600 is also defined through the M2 layer. That is, interconnecting/routing for the RF FET 600 is fixed below the M2 layer. An RF designer, therefore, has no ability to modify the interconnecting/routing of the RF FET 600 below the M2 layer. That is, interconnection/routing to the gate and the source/drain regions are all fixed in the schematic simulation of the RF FET 600 through the C4 layer, which limits flexibility. Additionally, the guard ring 650 is not reconfigurable, so schematic simulation and design of the RF FET 600 is bulky.

Figure 6C:
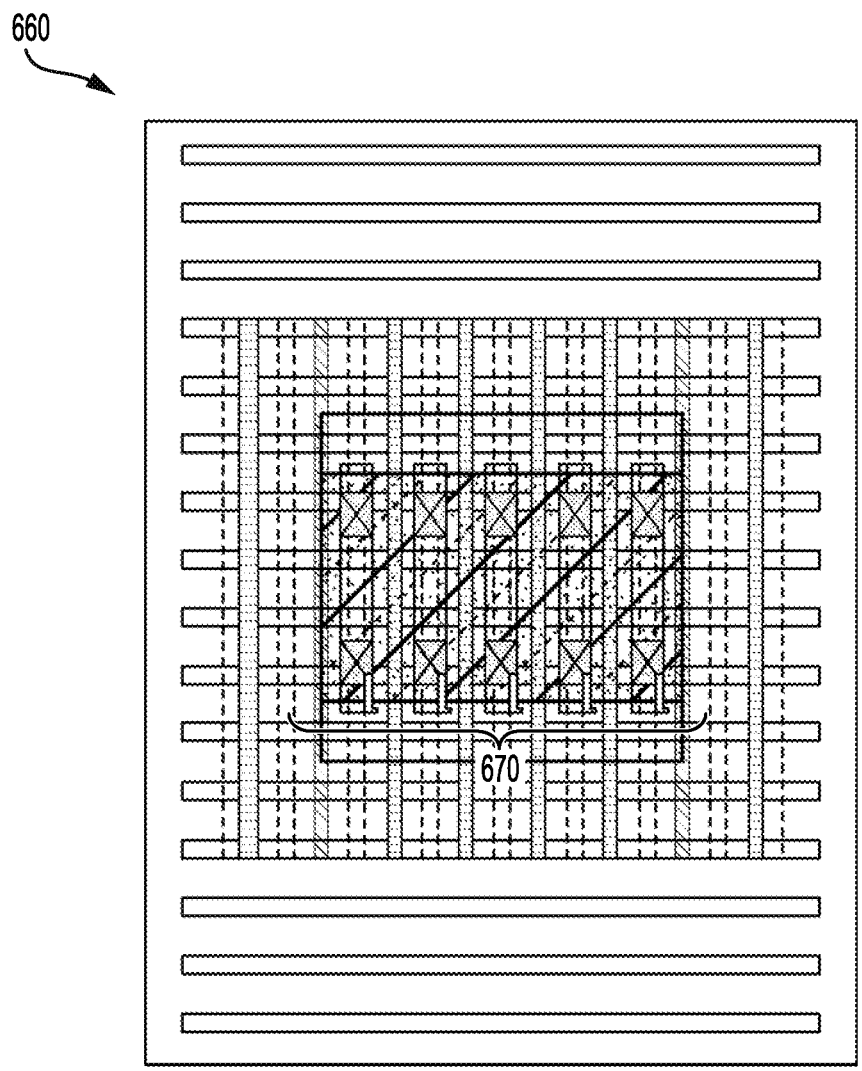
FIG. 6C illustrates a schematic layout of a conventional baseband (BB) field effect transistor (FET).
Figure 6D:
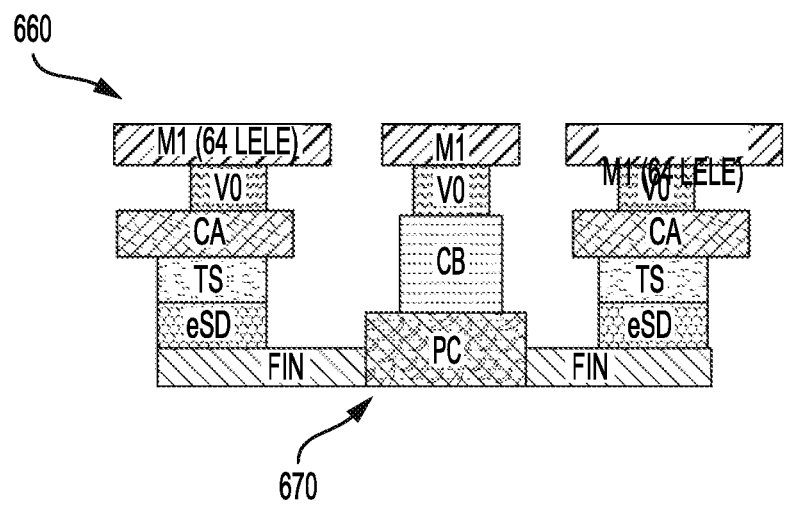
FIG. 6D illustrates a cross-sectional view of the BB FET of FIG. 6C.

FIGS. 6C-6D illustrate a schematic layout and a cross-sectional view of a conventional baseband (BB) field effect transistor (FET) 660. The BB FET 660 includes a transistor 670 with a gate, a source, and a drain. The transistor 670 includes fins (FIN) coupled to a polysilicon contact (PC) layer. Each fin supports either a source region or a drain region (eSD). In addition, trench interconnects (CA) are coupled to each of the source/drain regions through a titanium silicide (TS) layer. An M1 layer is coupled to the trench interconnect CA through a via V0. Additionally, the PC layer supports a trench interconnect (CB) for contacting the gate. Layer M1 is coupled to CB through via V0. The BB FET 660 does not include a guard ring and RF parasitic elements for RF circuit performance optimization. Furthermore, the interconnection/routing in the schematic simulation and design of the BB FET 660 is also fixed through the M1 layer, which severely restricts RF design flexibility.

As described above, conventional active and passive devices produced by a foundry are often for logic design. For example, these logic design devices do not include radio frequency (RF) components for schematic simulation and, therefore, are not optimized for RF layout simulation and design. Additionally, these conventional active and passive logic devices do not include a guard ring, which is an important component of RF circuits. Conventional active and passive RF devices produced by the foundry are based upon a traditional fixed p-cell methodology, which limits routing below the M2 layer (or C4 layer). Because of this, there is less flexibility in integrated circuit design for connecting devices in lower metal layers, such as the M1 layer, which leads to restrictions in the RF design.

Aspects of the present disclosure describe a semiconductor device for radio frequency (RF) applications. The semiconductor device may include a guard ring for surrounding the semiconductor device and at least one other semiconductor device. The semiconductor device may further include a level zero interconnect layer (e.g., M0) coupled to a first interconnect layer (e.g., M1) through contacts and vias. The first interconnect layer may be used for routing to the semiconductor device.

Figure 7A:
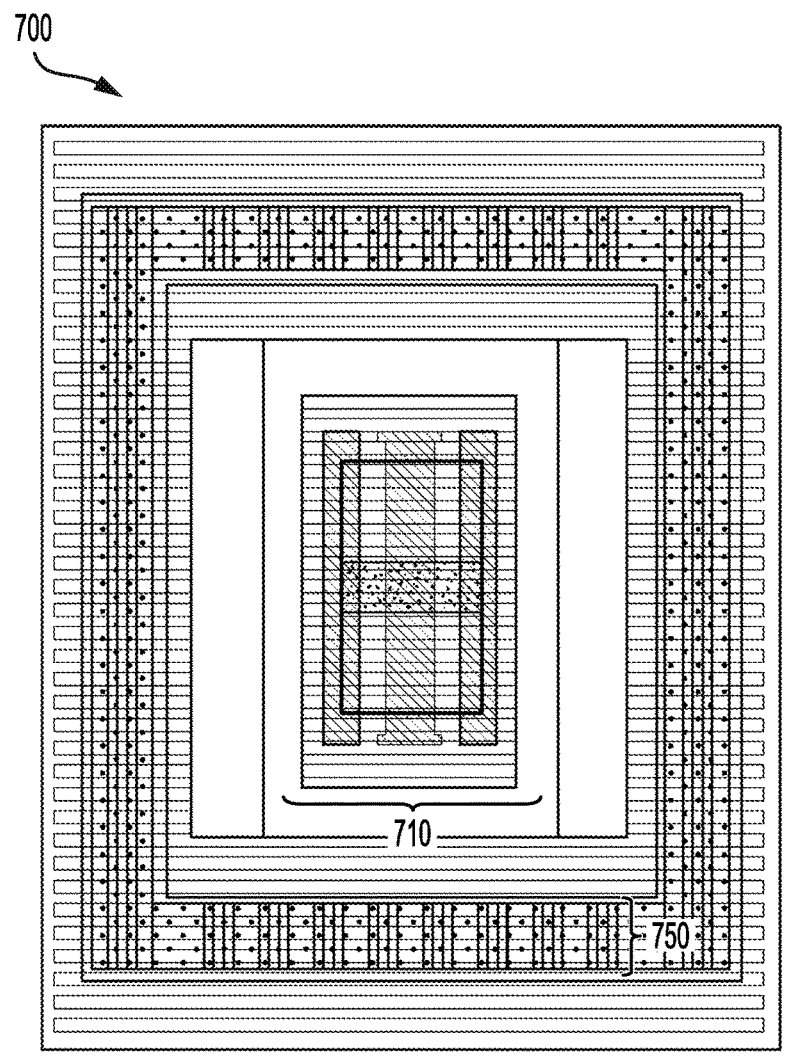
FIG. 7A illustrates a schematic layout of an improved baseband (BB+) metal-oxide-semiconductor (MOS) variable capacitor (BB+ MosVar) according to aspects of the present disclosure.
Figure 7B:
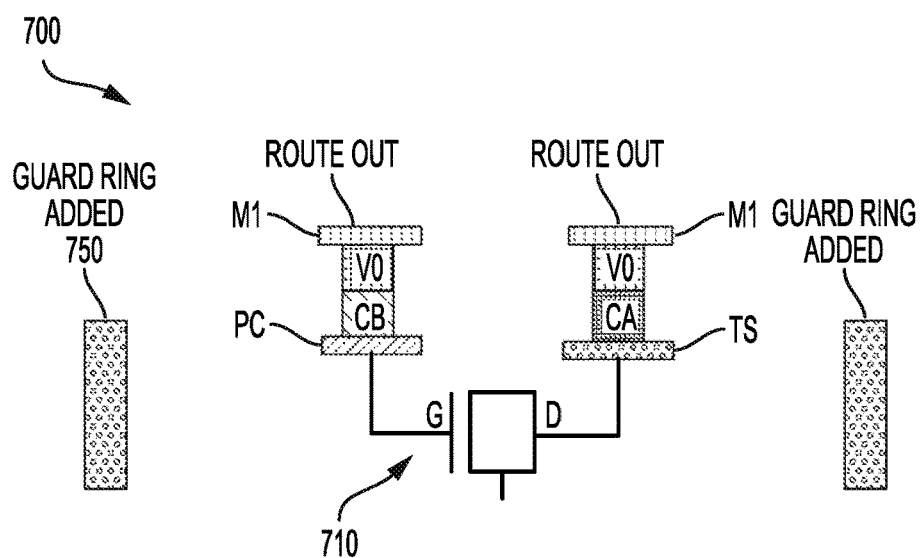
FIG. 7B illustrates a cross-sectional view of the BB+ MosVar of FIG. 7A according to aspects of the present disclosure.
Figure 9:
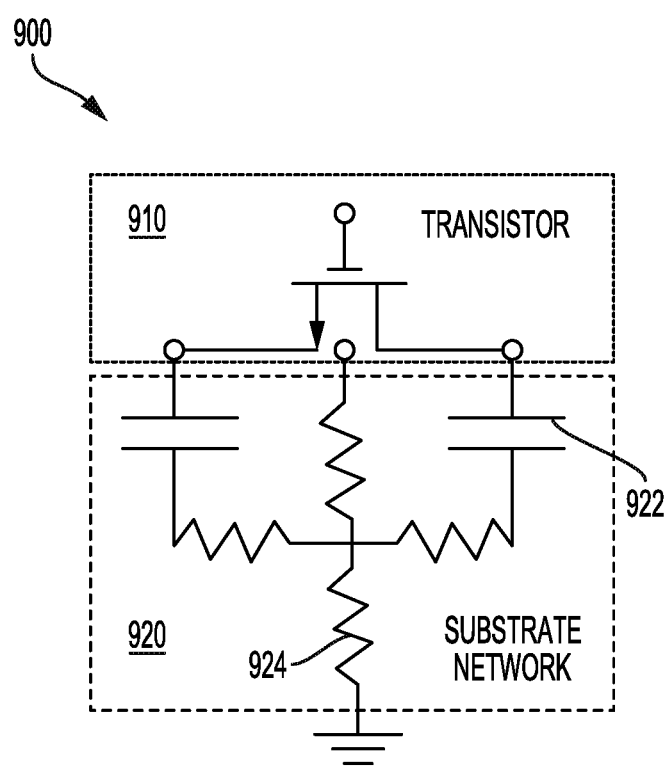
FIG. 9 illustrates a schematic model of radio frequency (RF) parasitic elements according to aspects of the present disclosure.

FIGS. 7A-7B illustrate a schematic layout and a cross-sectional view of an improved baseband (BB+) metal-oxide-semiconductor (MOS) variable capacitor (BB+ MosVar) 700 according to aspects of the present disclosure. The BB+ MosVar 700 may include a device 710 and a guard ring 750. The BB+ MosVar 700 may also include a model of RF parasitic elements (as shown in FIG. 9).

As shown in FIG. 7B, the device 710 may include a gate (G) and a drain (D). A polysilicon contact (PC) layer may be coupled to the gate, and an M1 layer (e.g., a first interconnect layer) may be coupled to the PC layer through a via V0 (e.g., a zero via) and a trench interconnect (CB) (e.g., a level zero interconnect). Additionally, a titanium silicide (TS) layer may be coupled to the drain, and the M1 layer may be coupled to the TS layer through the via V0 and a trench interconnect (CA) (e.g., a level zero interconnect). The PC layer and the TS layer may form a level zero contact layer. In this schematic simulation and design, the M1 layer is available for routing to other MOS devices.

According to an aspect of the present disclosure, the BB+ MosVar 700 may be a MOS p-cell device. For example, the MOS p-cell device may be a MOS varactor, in which the level zero contact layer is coupled to a gate and a drain of the MOS varactor. Additionally, the MOS p-cell device may be a MOS field effect transistor (FET) (MOSFET), in which the level zero contact layer is coupled to a source, a gate, and a drain of the MOSFET.

According to additional aspects, the BB+ MosVar 700 may include a P-type substrate with the guard ring 750 being P-doped. Alternatively, the BB+ MosVar 700 may include an N-type substrate and the guard ring 750 is N-doped. The guard ring 750 may surround multiple MOS devices, and may be configurable. According to aspects, the guard ring 750 may be included or not included in the BB+ MosVar 700. The guard ring 750 may also extend into an adjacent p-cell to surround an adjacent MOS device.

The BB+ MosVar 700 is an enhanced MOS varactor that combines the advantages of both the RF MosVar 500 and BB MosVar 560 devices while also making up for their deficiencies. For example, when compared to the RF MosVar 500, the BB+ MosVar 700 does not have a fixed p-cell to M2 layer and may be routed out from the M1 level, providing much more design flexibility for RF design. Additionally, when compared to the BB MosVar 560, the BB+ MosVar 700 includes a guard ring 750 (e.g., an RF guard ring) in the layout for RF circuit performance improvement. Schematically, the BB+ MosVar 700 also includes a model of RF parasitic elements for more accurate RF simulations.

Schematic advantages include increased RF model simulation design accuracy by including the model of RF parasitic elements. Layout advantages include ease of design for p-cells because there are no p-cell constraints up to the M2 layer, and flexibility for chip layout design resulting in chip area reduction. Additional advantages include a significant reduction in the gap between schematic and layout design, which therefore reduces design cycles for faster design success.

Figure 8A:
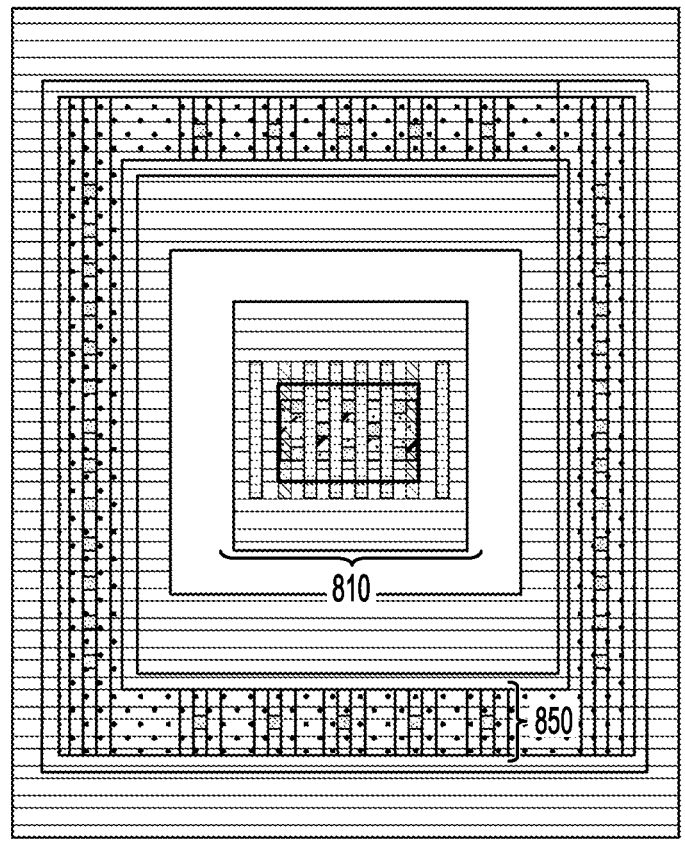
FIG. 8A illustrates a schematic layout of an improved baseband (BB+) field effect transistor (FET) according to aspects of the present disclosure.
Figure 8B:
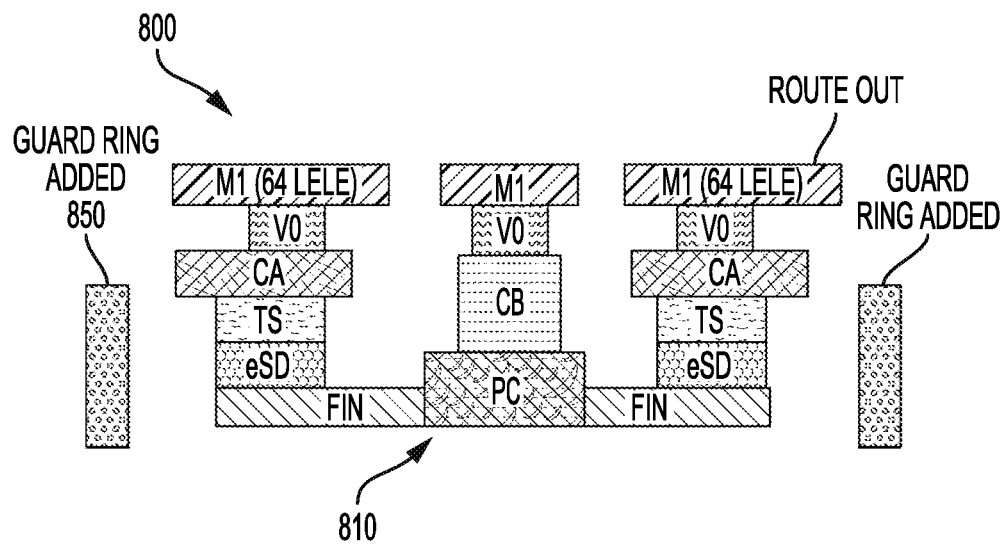
FIG. 8B illustrates a cross-sectional view of the BB+ FET of FIG. 8A according to aspects of the present disclosure.

FIGS. 8A-8B illustrate a schematic layout and a cross-sectional view of an improved baseband (BB+) field effect transistor (FET) 800 according to aspects of the present disclosure. The BB+ FET 800 may include a transistor 810 and a guard ring 850. The BB+ FET 800 may also include a model of RF parasitic elements (as shown in FIG. 9).

As shown in FIG. 8B, the transistor 810 may include a gate, a source region, and a drain region. Fins (FIN) may be coupled to a polysilicon contact (PC) layer. Each fin may support either the source region or the drain region (eSD). Trench interconnects (CA) (e.g., a level zero contact layer) may be coupled to each of the source region or the drain region through a titanium silicide (TS) layer (e.g., a level zero interconnect). An M1 layer (e.g., a first interconnect layer) may be coupled to the CA trench interconnect through a via V0 (e.g., a zero via). Additionally, the PC layer may support a trench interconnect (CB) (e.g., a level zero interconnect) for contacting the gate. The M1 layer may be coupled to CB through the via V0. The M1 layer is available for routing to other MOS devices.

According to an aspect of the present disclosure, the BB+ FET 800 may be a MOS p-cell device. For example, the MOS p-cell device may be a MOS varactor, in which the level zero contact layer is coupled to a gate and a drain of the MOS varactor. Additionally, the MOS p-cell device may be a MOS field effect transistor (FET) (MOSFET), in which the level zero contact layer is coupled to a source, gate, and a drain of the MOSFET.

According to additional aspects, the BB+ FET 800 may include a P-type substrate with the guard ring 850 being P-doped. Alternatively, the BB+ FET 800 may include an N-type substrate and the guard ring 850 is N-doped. The guard ring 850 is also configurable. For example, the guard ring 850 may surround multiple MOS devices. In addition, the guard ring 850 may also extend into an adjacent p-cell to surround an adjacent MOS device. Configurability of the guard ring 850 may also optionally enable omission of the guard ring 850 from the schematic layout of the BB+ FET 800.

The BB+ FET 800 combines the advantages of both the RF FET 600 and BB FET 660 devices while also making up for their deficiencies. For example, when compared to the RF FET 600, the BB+ FET 800 does not have a fixed p-cell to the M2 layer and may be routed out from the M1 level, providing much more design flexibility for RF design. Additionally, when compared to the BB FET 660, the BB+ FET 800 includes a guard ring 850 (e.g., an RF guard ring) in the layout for RF circuit performance improvement. Schematically, the BB+ FET 800 also includes a model of RF parasitic elements for more accurate RF simulations.

FIG. 9 illustrates a schematic model 900 of radio frequency (RF) parasitic elements according to aspects of the present disclosure. The schematic model 900 may include a transistor 910 coupled to a substrate network 920. For example, the substrate network 920 may include capacitors 922, resistors 924, and inductors (not shown). The schematic model 900 may model RF parasitic elements for the above-described BB+ MosVar 700 and BB+ FET 800 for improved performance. For example, the schematic model 900 may estimate substrate resistance and substrate coupling capacitance.

The capacitors 922 and resistors 924 may be coupled together in series and/or in parallel as shown. It is understood that the schematic model 900 is exemplary only, and other layouts are possible. For example, the capacitors 922 and resistors 924 illustrated in FIG. 9 may also include inductors. Additionally, inductors or other active or passive devices may replace or be added to the schematic model 900.

Figure 10:
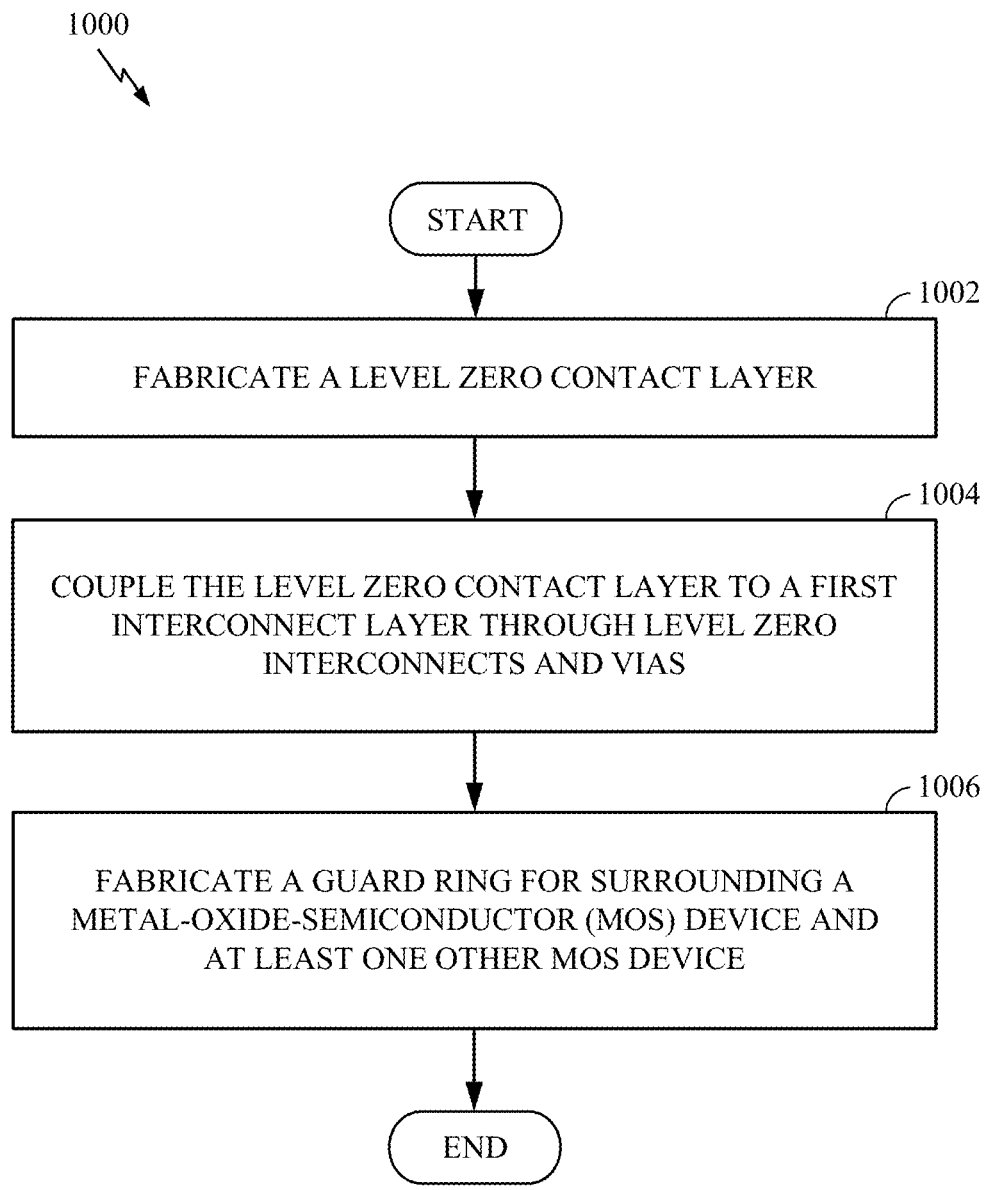
FIG. 10 illustrates a method for fabricating a metal-oxide-semiconductor (MOS) device according to aspects of the present disclosure.

FIG. 10 is a process flow diagram illustrating a method 1000 of fabricating a metal-oxide-semiconductor (MOS) device according to aspects of the present disclosure. The method 1000 begins at block 1002, in which a level zero contact layer is fabricated. For example, as shown in FIGS. 7B and 8B, a level zero contact layer may be fabricated including a polysilicon contact (PC) layer and a trench silicide (TS) layer.

At block 1004, the level zero contact layer is coupled to a first interconnect layer through level zero interconnects and vias. For example, as shown in FIGS. 7B and 8B, the level zero contact layer may be coupled to the first interconnect layer (M1) through a contact to active (CA) trench interconnect, a gate to open (CB) trench interconnect, and zero layer vias (V0).

At block 1006, a guard ring is fabricated for surrounding the MOS device and at least one other MOS device. For example, as shown in FIGS. 7A and 8A, the guard ring (e.g., 750 or 850) may surround the semiconductor device.

According to an aspect of the present disclosure, a metal-oxide-semiconductor (MOS) device is described. In one configuration, the MOS device includes means for guarding. The guarding means may be a guard ring. In another aspect, the aforementioned means may be any module or any apparatus or material configured to perform the functions recited by the aforementioned means.

Figure 11:
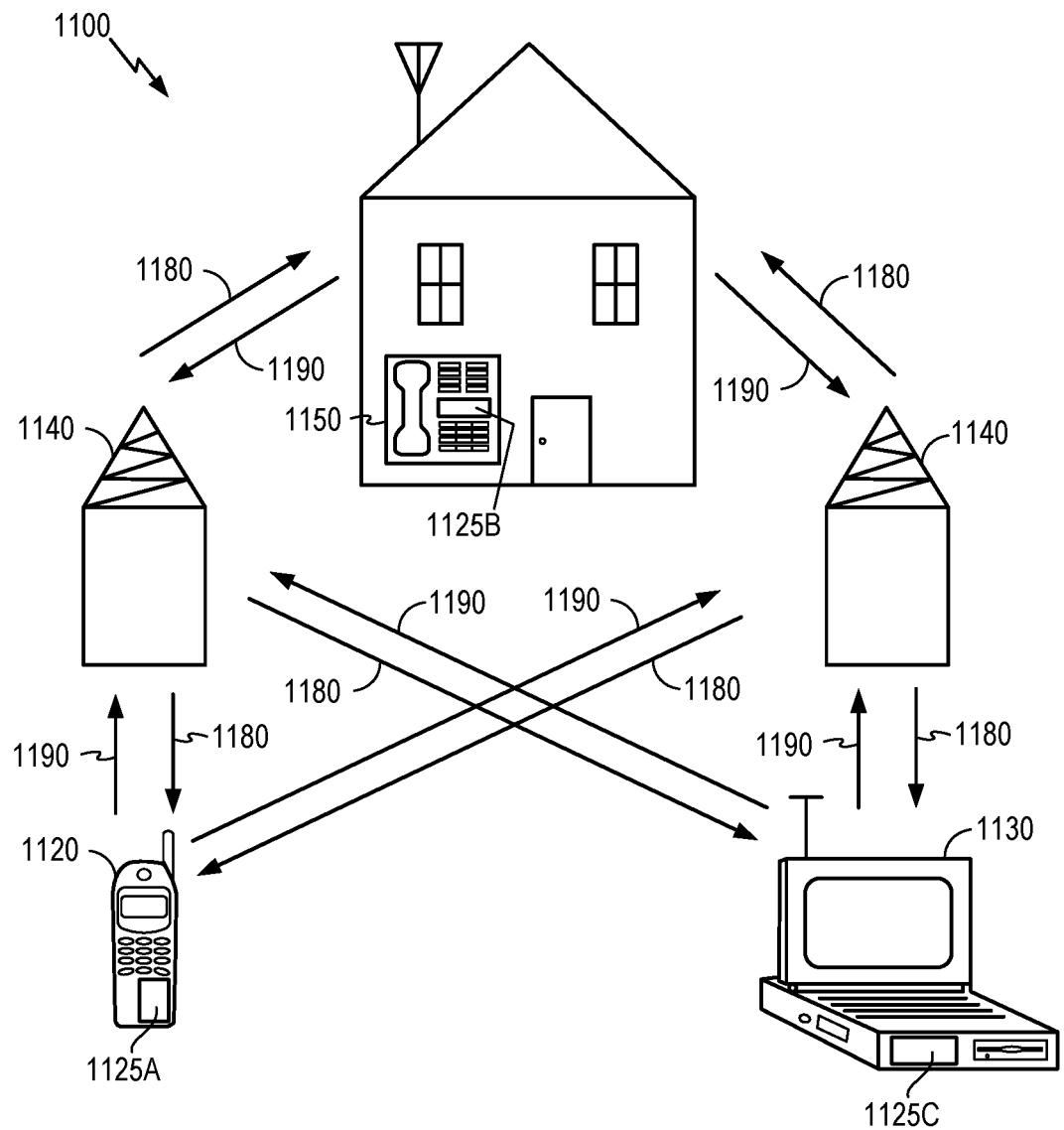
FIG. 11 is a block diagram showing an exemplary wireless communication system in which an aspect of the disclosure may be advantageously employed.

FIG. 11 is a block diagram showing an exemplary wireless communication system 1100 in which an aspect of the disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed MOS device. It will be recognized that other devices may also include the disclosed MOS device, such as the base stations, switching devices, and network equipment. FIG. 11 shows forward link signals 1180 from the base station 1140 to the remote units 1120, 1130, and 1150 and reverse link signals 1190 from the remote units 1120, 1130, and 1150 to base station 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communication systems (PCS) unit, a portable data unit such as a personal data assistant, a GPS enabled devices, a navigation device, a set top box, a music player, a video player, an entertainment unit, a fixed location data unit such as meter reading equipment, or other devices that store or retrieve data or computer instructions, or combinations thereof. Although FIG. 11 illustrates remote units according to the aspects of the disclosure, the disclosure is not limited to these exemplary illustrated units. Aspects of the disclosure may be suitably employed in many devices, which include the disclosed MOS device.

Figure 12:
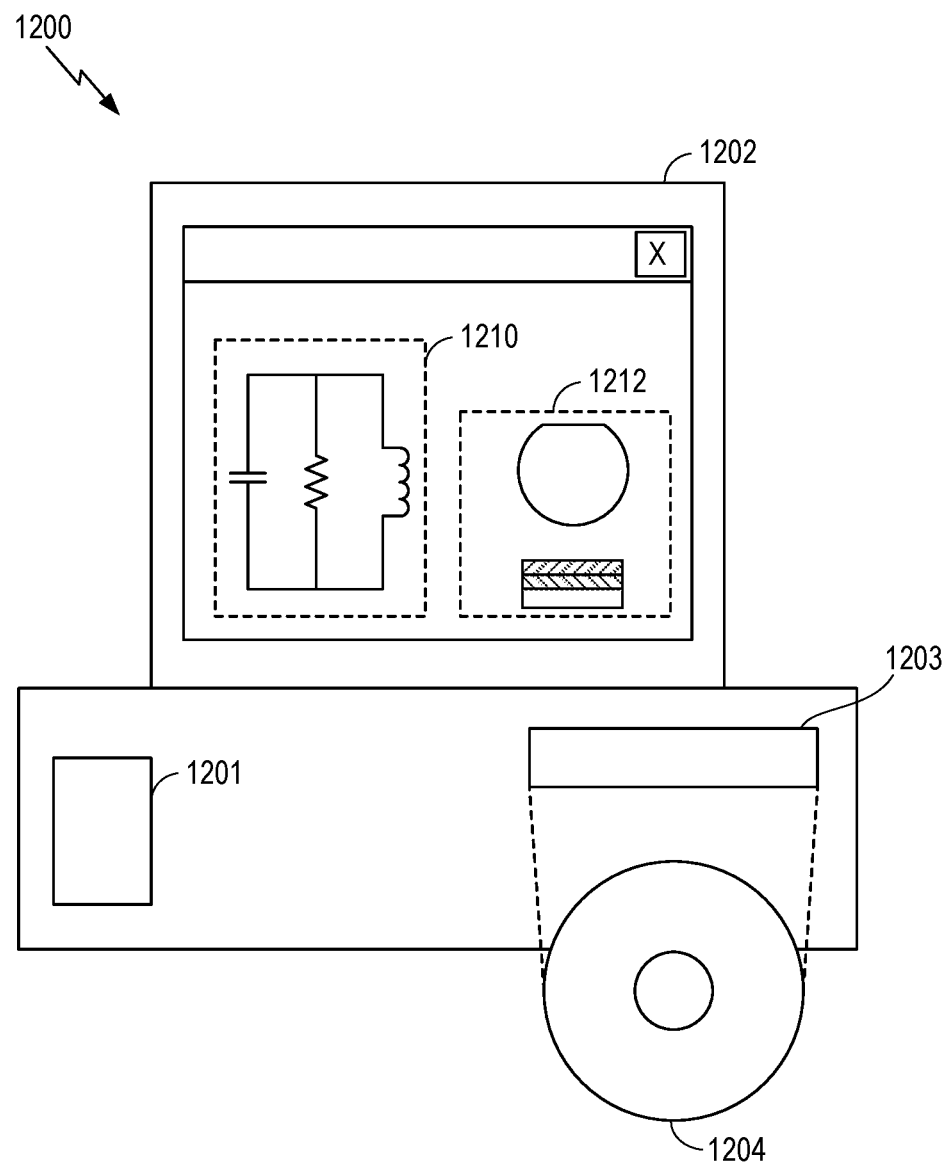
FIG. 12 is a block diagram illustrating a design workstation used for circuit, layout, and logic design of a fin-based structure according to one configuration.

FIG. 12 is a block diagram illustrating a design workstation used for circuit, layout, and logic design of an IC structure, such as the MOS device disclosed above. A design workstation 1200 includes a hard disk 1201 containing operating system software, support files, and design software such as Cadence or OrCAD. The design workstation 1200 also includes a display 1202 to facilitate design of a circuit 1210 or an IC device 1212 including the disclosed MOS device. A storage medium 1204 is provided for tangibly storing the design of the circuit 1210 or the IC device 1212. The design of the circuit 1210 or the IC device 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the IC device 1212 including the disclosed MOS device by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on non-transitory computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A metal-oxide-semiconductor (MOS) varactor p-cell device for radio frequency (RF) design, the p-cell device comprising:
    a configurable guard ring to surround a plurality of drain regions of MOS varactor devices;
    a model of RF parasitic elements; and
    a level zero contact layer coupled to a first interconnect layer through level zero interconnects and vias, the first interconnect layer available for routing to the MOS varactor cell device, in which a portion of the configurable guard ring within a middle-of-line (MOL) layer surrounds at least a portion of one of the level zero interconnects in the middle-of-line (MOL) layer.

2. The MOS varactor p-cell device of claim 1, in which the level zero contact layer is coupled to a gate and a drain of the MOS varactor p-cell device.

3. The MOS varactor p-cell device of claim 1, in which the model of RF parasitic elements is configured to estimate substrate resistance and substrate coupling capacitance.

4. The MOS varactor p-cell device of claim 1, in which the MOS varactor p-cell device comprises a P-type substrate and the configurable guard ring is P-doped.

5. The MOS varactor p-cell device of claim 1, in which the MOS p-cell device comprises an N-type substrate and the configurable guard ring is N-doped.

6. The MOS varactor p-cell device of claim 1, integrated into a mobile phone, a set top box, a music player, a video player, an entertainment unit, a navigation device, a computer, a hand-held personal communication systems (PCS) unit, a portable data unit, and/or a fixed location data unit.

7. A baseband (BB) metal-oxide-semiconductor field effect transistor (MOSFET) p-cell device for radio frequency (RF) design, the p-cell device comprising:
 a configurable guard ring to surround a plurality of source and/or drain regions of BB MOSFET p-cell devices;
 a model of RF parasitic elements; and
 a level zero contact layer coupled to a first interconnect layer through level zero interconnects and vias, the first interconnect layer available for routing to the BB MOSFET cell device, in which a portion of the configurable guard ring within a middle-of-line (MOL) layer surrounds at least a portion of one of the level zero interconnects in the middle-of-line (MOL) layer in which the level zero contact layer is coupled to a source, gate, and a drain of the MOSFET p-cell device.

8. A metal-oxide-semiconductor (MOS) varactor p-cell device for radio frequency (RF) design, the p-cell device comprising:
 a configurable guard ring extending into an adjacent p-cell;
 a model of RF parasitic elements; and
 a level zero contact layer coupled to a first interconnect layer through level zero interconnects and vias, the first interconnect layer available for routing to the MOS varactor cell device, in which a portion of the configurable guard ring in a middle-of-line (MOL) layer surrounds at least a portion of one of the level zero interconnects in the middle-of-line (MOL) layer.

9. The MOS varactor p-cell device of claim 8, in which the model of RF parasitic elements is configured to estimate substrate resistance and substrate coupling capacitance.

10. The MOS varactor p-cell device of claim 8, in which the MOS varactor p-cell device comprises a P-type substrate and the configurable guard ring is P-doped.

11. The MOS varactor p-cell device of claim 8, in which the MOS varactor p-cell device comprises an N-type substrate and the configurable guard ring is N-doped.

12. A metal-oxide-semiconductor (MOS) varactor p-cell device for radio frequency (RF) design, the p-cell device comprising:
 a configurable guard ring extending into an adjacent p-cell to surround an adjacent MOS varactor device;
 a model of RF parasitic elements; and
 a level zero contact layer coupled to a first interconnect layer through level zero interconnects and vias, the first interconnect layer available for routing to the MOS varactor cell device, in which a portion of the configurable guard ring in a middle-of-line (MOL) layer surrounds at least a portion of one of the level zero interconnects in the middle-of-line (MOL) layer.

13. The MOS varactor p-cell device of claim 12, in which the model of RF parasitic elements is configured to estimate substrate resistance and substrate coupling capacitance.

14. The MOS varactor p-cell device of claim 12, in which the MOS varactor p-cell device comprises a P-type substrate and the configurable guard ring is P-doped.

15. The MOS varactor p-cell device of claim 12, in which the MOS varactor p-cell device comprises an N-type substrate and the configurable guard ring is N-doped.

* * * * *